United States Patent [19]

Sachs et al.

[11] 4,335,081
[45] Jun. 15, 1982

[54] CRYSTAL GROWTH FURNACE WITH TRAP DOORS

[75] Inventors: Emanual M. Sachs, Watertown; Brian H. Mackintosh, Lexington, both of Mass.

[73] Assignee: Mobil Tyco Solar Energy Corporation, Waltham, Mass.

[21] Appl. No.: 232,570

[22] Filed: Feb. 9, 1981

Related U.S. Application Data

[63] Continuation of Ser. No. 3,765, Jan. 15, 1979, abandoned.

[51] Int. Cl.³ .............................................. C30B 15/34
[52] U.S. Cl. .................................. 422/246; 422/249; 432/250; 110/173 R
[58] Field of Search ............... 422/245, 246, 248, 249; 432/250; 251/59, 309; 110/173 R, 173 A, 173 B, 173 C, 174–180

[56] References Cited

U.S. PATENT DOCUMENTS

| | | | |
|---|---|---|---|
| 1,993,786 | 3/1935 | Hollender | 110/176 |
| 2,139,776 | 12/1938 | Simpson | 432/250 |
| 2,977,106 | 3/1961 | Duff | 432/250 |
| 3,410,547 | 11/1968 | Bielefeldt | 110/173 R |
| 3,688,645 | 9/1972 | Reaves | 251/59 |
| 3,752,041 | 8/1973 | Smith | 251/59 |
| 4,010,930 | 3/1977 | Sands | 251/309 |
| 4,113,228 | 9/1978 | Frye | 251/309 |
| 4,118,197 | 10/1978 | Mackintosh et al. | 422/246 |
| 4,213,446 | 7/1980 | Stookey et al. | 126/192 |

Primary Examiner—Gregory N. Clements
Attorney, Agent, or Firm—Schiller & Pandiscio

[57] ABSTRACT

An improved furnace is provided for growing crystalline bodies from a melt. The improved furnace is characterized by a door assembly which is remotely controlled and is arranged so as to selectively shut off or permit communication between an access port in the furnace enclosure and a hot zone within that enclosure. The invention is especially adapted to facilitate use of crystal growing cartridges of the type disclosed in U.S. Pat. No. 4,118,197.

25 Claims, 6 Drawing Figures

CRYSTAL GROWTH FURNACE WITH TRAP DOORS

This invention was made under a NASA contract.

This is a continuation of Ser. No. 003,765 filed Jan. 15, 1979, now abandoned.

This invention relates to the art of growing crystals and more particularly to an improvement in furnaces adapted for growing elongate crystalline bodies from a melt.

PRIOR ART

A number of different processes are known from growing crystalline bodies from a melt. One process which is known to persons skilled in the art is the so-called EFG process (the term EFG is an acronym derived from the term "Edge-Defined, Film-Fed Growth") described in U.S. Pat. No. 3,591,348. In the EFG process the shape of the crystalline body which is grown is determined by the external or edge configuration of the upper end of a forming member which, for want of a better name, is commonly called a die. The die is provided with one or more capillaries and the EFG process involves growth on a seed from melt which is located between the growing body and the upper end of the die, with the melt being continuously replenished from a suitable melt reservoir by action of capillary rise via the capillary or capillaries in the die. The growing body grows to the shape of the edge configuration of the top end of the die. A significant advantage of the EFG process is that it is useful in growing diverse materials such as silicon and alumina in various shapes, including thin flat ribbons and cylindrical tubes.

The growth of crystals by the EFG process usually involves the use of die-holders, heat shields, heaters, after-heaters, and guides in addition to the dies. If the furnace is an induction heated machine rather than a resistance type machine, a susceptor is employed in place of the electrical resistance heater(s). Such components are precisely made and must be accurately positioned within the furnace above a crucible of molten feed material, i.e., the melt, so that the feed material will be drawn into the die by capillary flow and will be converted by solidification to a substantially monocrystalline body of preselected cross sectional configuration. The components disposed within the furnace also generally include an insulation pack consisting of one or more insulating members which help define a "hot-zone" around the crucible and die. Crystal growth occurs in the hot zone and, therefore, control of the temperature distribution in the hot zone is a critical prerequisite to control of crystal growth. The insulation may be arranged so that the hot-zone may include an accessway or port providing top access to the die and crucible. In any event, the furnace generally comprises an outer shell having a top port for permitting access to the die and crucible. Unfortunately the accessway in the insulation pack provides an escape route permitting hot gases in the hot-zone to enter the space around the hot-zone defined by the furnace shell, thereby resulting in a loss of heat from the hot zone. The same accessway also constitutes a path whereby energy may be lost by radiation to the furnace shell and the surrounding environment. In addition the port(s) in the furnace shell provides an avenue whereby ambient atmosphere may enter the furnace, resulting in oxidation of many of the components therein. The presence of an oxidizing gas in the furnace is particularly deleterious where the melt is silicon.

The growth components consisting of die-holders, heat shields, etc., may be assembled and separately installed in the furnace in proper relation to the crucible while the furnace is in cold condition. In the event any of such components become defective, it is necessary not only to terminate the crystal growth but also to cool the furnace to room temperature before the defective part can be replaced. This cooling phase is time-consuming and the replacement of a defective component may involve disassembly and reassembly of other adjacent components as well as component realignment procedures. As a consequence of such problems, individual crystal growth cartridges have been designed which essentially include a die, die-holder, and associated critical growth control elements such as heat shield(s), heater(s), cooling shoes, after-heaters, thermocouples, etc., arranged as a unitary assembly which can be inserted into a furnace while the furnace is at operating temperature and can also be removed without first having to cool the furnace down to room temperature. Such cartridges are disclosed in U.S. Pat. No. 4,118,197, issued Oct. 3, 1978, to Brian H. Mackintosh et al. An obvious advantage is that a plurality of such cartridges may be employed with a single furnace. However, when using cartridges as described by U.S. Pat. No. 4,118,197, the port(s) in the furnace and the hot-zone must be of substantial size, thereby providing a large (1) heat loss potential and (2) ambient atmosphere passageway between the hot-zone and the atmosphere exterior of the furnace. In addition, since the cartridges are designed to facilitate withdrawal of the growth system for repairs and/or parts replacement without necessitating furnace shut-down, full use of the cartridge technology, i.e., operation of two or more cartridges exacerbates the aforementioned problems associated with the existence of ports in the furnace.

SUMMARY OF THE INVENTION

The primary object of this invention is to provide closures for ports in a furnace of the type described for the purpose of reducing loss of heat and at the same time providing a barrier to the introduction of ambient atmosphere to the furnace interior.

A more specific object of the invention is to provide closures for ports in the furnace shell and hot-zones within the furnace which may be placed in open and closed position while the furnace is cold or at an elevated temperature and which may be employed in conventional furnaces without requiring extensive modification of the furnace.

Another object is to provide a system for growing silicon bodies comprising movable closures for the purpose described which constitute a minimum of contamination sources, thereby assuring a "clean" growth environment.

Still another object of the invention is to provide closures of the character described in combination with a simple and reliable remotely controlled actuating means.

A further specific object is to provide closures of the character described especially adapted for use in furnaces which are employed for growing crystalline bodies made of silicon.

The foregoing objects as well as other objects hereinafter disclosed or rendered obvious, are achieved by providing a trap door assembly which is adapted to be disposed in the entrance port of the shell of a furnace and includes a trap door member which is arranged so as to selectively close to shut off communication between that port and a hot-zone within the furnace, or open to permit the introduction of a crystal growth cartridge into the furnace in operative position with a crucible contained within the hot-zone.

Other features and many of the attendant advantages of the present invention are set forth in the following detailed description of a preferred embodiment of the invention which is to be considered together with the accompanying drawings.

THE DRAWINGS

FIG. 1 is an enlarged diagramatic view in cross-section of a crystal growing furnace embodying a cartridge of the type disclosed in U.S. Pat. No. 4,118,197;

FIG. 2 is a side view in elevation of a furnace constructed in accordance with the present invention, in association with a plurality of pulling mechanisms and a plurality of crystal growth cartridges of the type disclosed in U.S. Pat. No. 4,118,197;

In the several views, the same numerals are used to designate identical components.

DEFINITIONS

Although the illustrated embodiment of the invention hereinafter described is arranged in a resistance heated crystal growth furnace adapted for growing silicon ribbon, it is to be understood that the term "furnace" is not to be so limited since the invention also may be used in furnaces which are arranged for growing crystalline bodies of another material and/or another cross-sectional shape and also with furnaces which may be inductively heated or furnaces which are not adapted to accommodate crystal growth cartridges.

As used in the following specification and/or claims, the terms "capillary die member" and "capillary die assembly" are intended to denote and should be interpreted as covering capillary dies designed to operate and to be used in the manner described in U.S. Pat. No. 3,591,348 and as further described in U.S. Pat. No. 4,118,197. The term "crystal growth cartridge" is intended to denote a cartridge which essentially contains a capillary die member, plus one or more associated crystal growth components from the group consisting of a die holder, heat shield(s), heater(s), cooling means for establishing a relatively steep temperature gradient immediately above the die so as to increase the growth rate, a heat conductive structure for cooling the crystal according to a relatively shallow, carefully controlled temperature gradient to reduce stresses, and other related components, all of which are assembled so as to form a unitary structure which can be installed in a furnace in cold condition, substantially as taught by U.S. Pat. No. 4,118,197.

SPECIFIC EXAMPLE OF PRIOR ART

Figure 1:
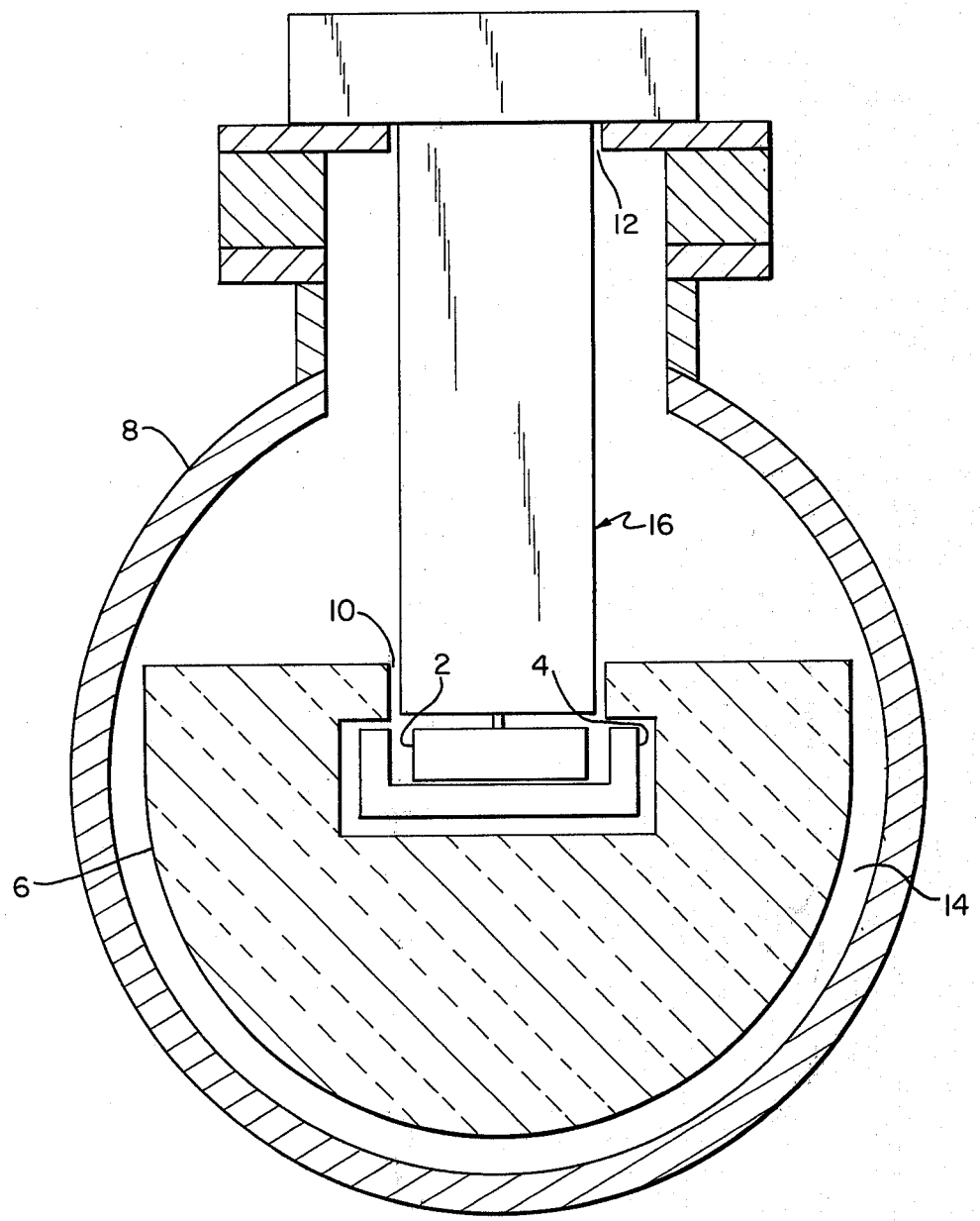

Turning now to the drawings, FIG. 1 schematically illustrates a typical resistance-heated, horizontally disposed crystal growth furnace in which a crucible 2 containing a melt is surrounded by resistance heaters 4 and an insulation pack 6. The insulation pack serves to minimize heat losses and keep the melt as nearly isothermal as possible. It is to be understood that in an induction heated machine, the resistance heater(s) would be replaced by a susceptor and an induction coil for heating the susceptor would be disposed outside of the insulation pack 6 but within the outer shell 8 of the furnace. The insulation pack, heaters, crucible, and the melt contained within the crucible, combined with their support hardware and components of instrumentation (not shown) for monitoring the temperature comprise the "hot-zone". A port 10 at the top of the hot-zone provides access to the melt in crucible 2. It is to be understood that the upper end of port 10 may be an opening in the insulation pack or an opening in a radiation shield that overlies the insulation pack. The outer shell 8 of the furnace surrounding the hot-zone defines an interface between the hot-zone and the ambient environment. Outer shell 8 absorbs heat lost through the insulation and also keeps the ambient atmosphere and impurities out of the hot-zone. In a typical furnace the outer shell is water cooled. The outer shell of the furnace also comprises a port 12 for providing access to the melt. The space 14 between the hot-zone and the outer shell serves as a buffer zone and generally is filled with an inert gas such as argon. At this point it is to be understood that the shape and the orientation of the furnace shell and the hot-zone may be varied, e.g. the shell may be rectangular in cross section or it may be vertically elongate with the port 10 located at its top end.

The ports 10 and 12 are the focus of this invention. Consider the role of these two ports when a growth cartridge is not used. Port 10 in the hot-zone provides an escape route whereby hot gases in the hot-zone may enter the buffer space 14, thereby resulting in a heat loss. The same port also constitutes a path whereby energy is lost by radiation from the hot zone to the furnace shell and the ambient environment, i.e. the atmosphere outside of the furnace. The port 12 in the shell, on the other hand, provides an opening whereby ambient atmosphere may enter the furnace and thereby result in oxidation of some or many of the components in this furnace. In the case of ribbon growth from a die which is fixed in the hot-zone, e.g. by a die which is mounted directly to the crucible 2, the ports 10 and 12 need only be large enough to accommodate the thin ribbon. In such case the losses incurred may be sufficiently small so that they may be neglected. However, in the case of growth from a cartridge 16 of the type disclosed in U.S. Pat. No. 4,118,197, the ports 10 and 12 must be of substantial extent and thus the losses incurred via those ports may be sufficiently large to impede successful crystal growth, for example, by preventing attainment within the furnace of sufficiently high temperature to melt the feed material. The present invention substantially eliminates the problems attendant to the presence of ports 10 and 12 by providing closures for both ports, with the closure for port 10 serving to keep hot gases in and provide radiation shielding for the hot zone, while the closure for port 12 acts as a barrier to introduction of ambient atmosphere.

PREFERRED EMBODIMENT OF THE INVENTION

The apparatus shown in FIGS. 2-6 incorporates a preferred embodiment of the invention which comprises a trap door arrrangement.

Figure 2:
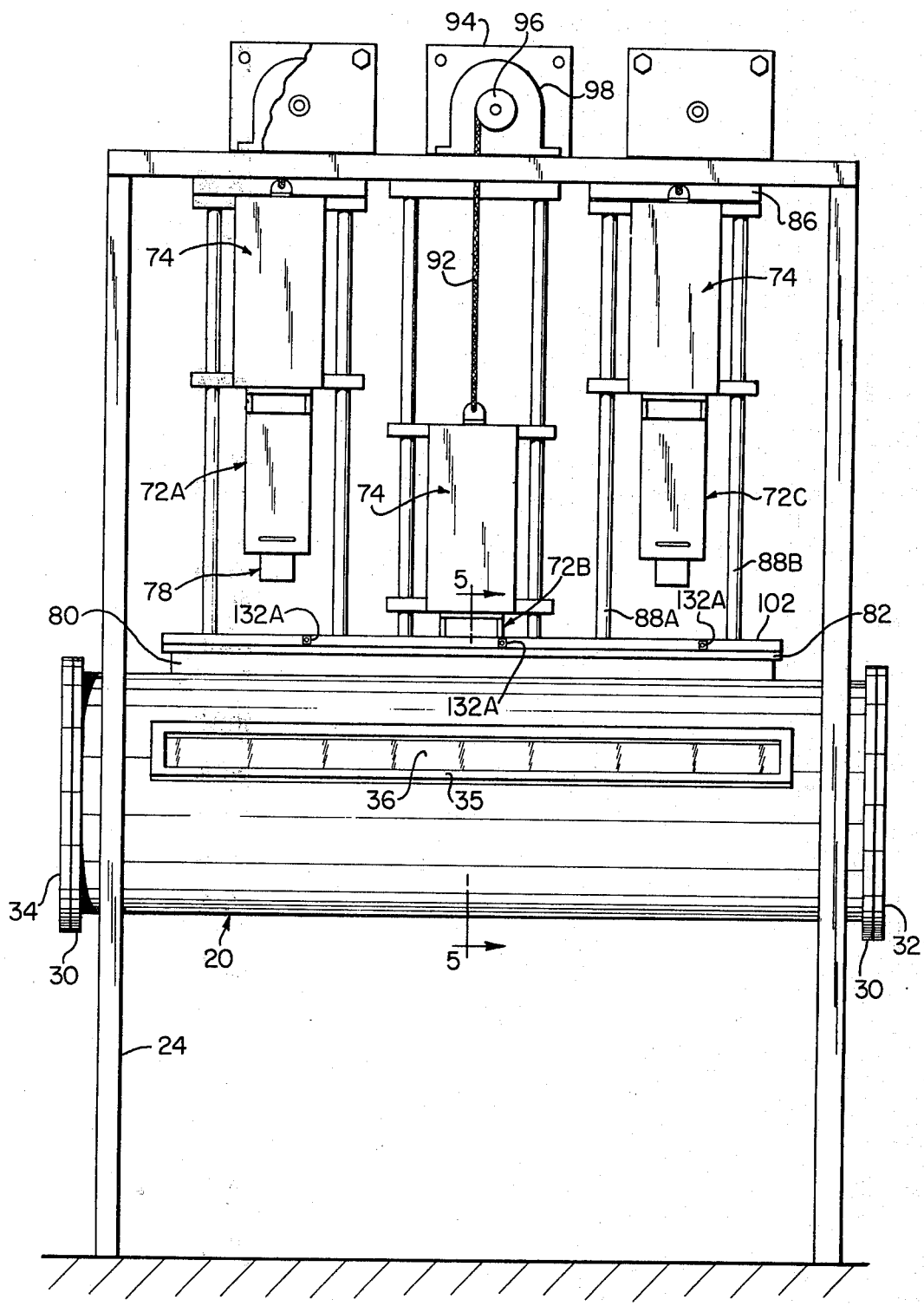
Figure 3:
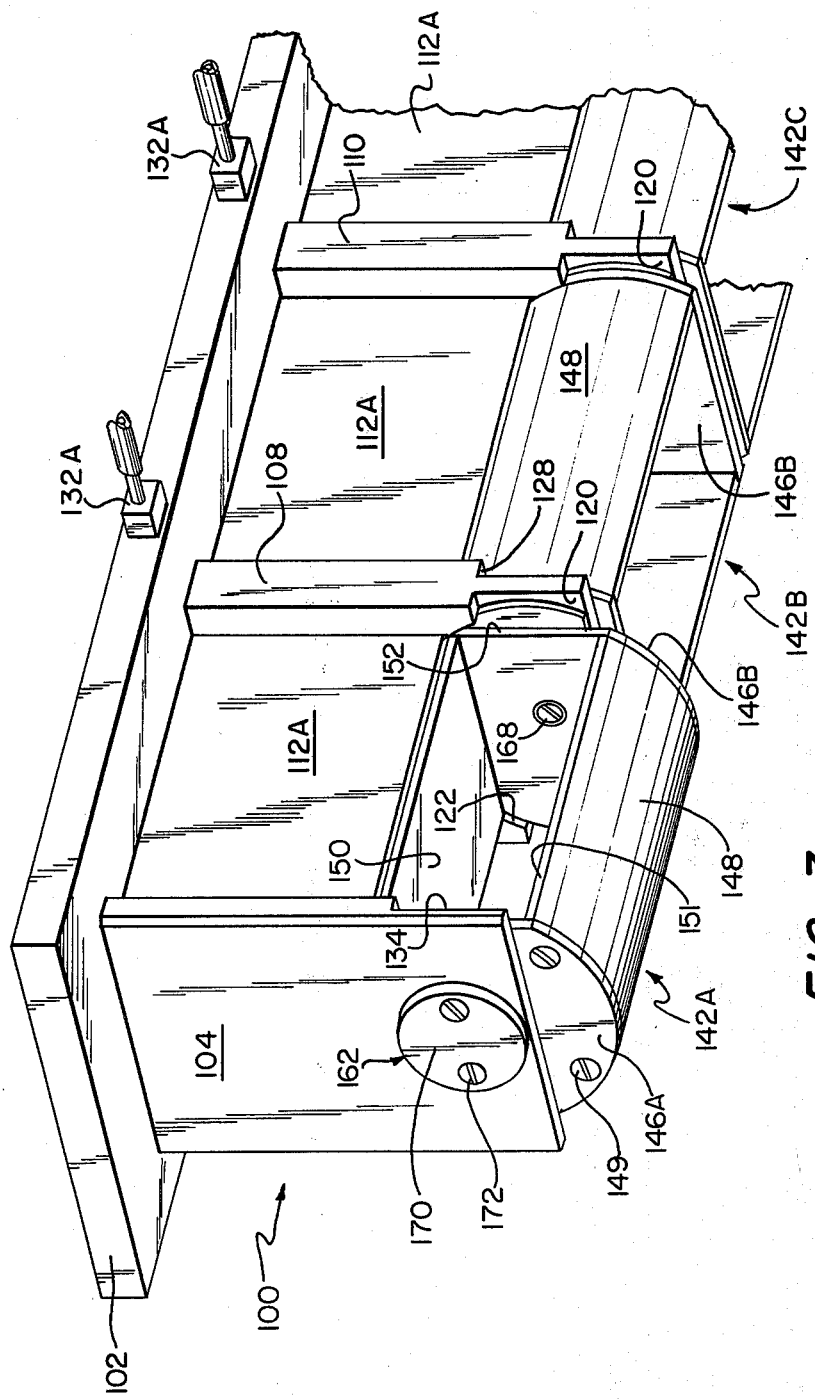
FIG. 3 is a perspective view of a trap door assembly provided in accordance with the present invention.
Figure 4:
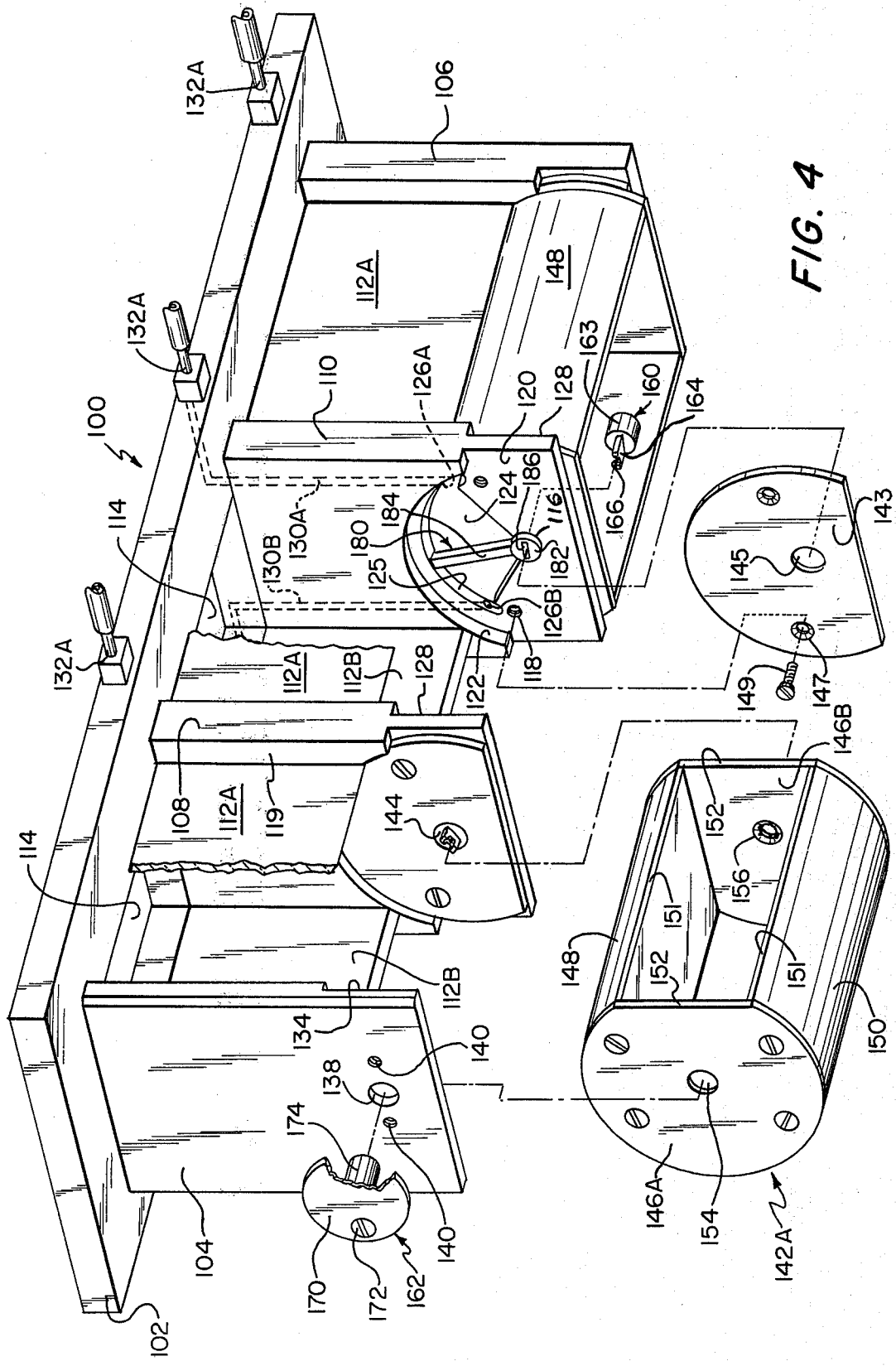
FIG. 4 is an exploded perspective view of the assembly of FIG. 3.
Figure 5:
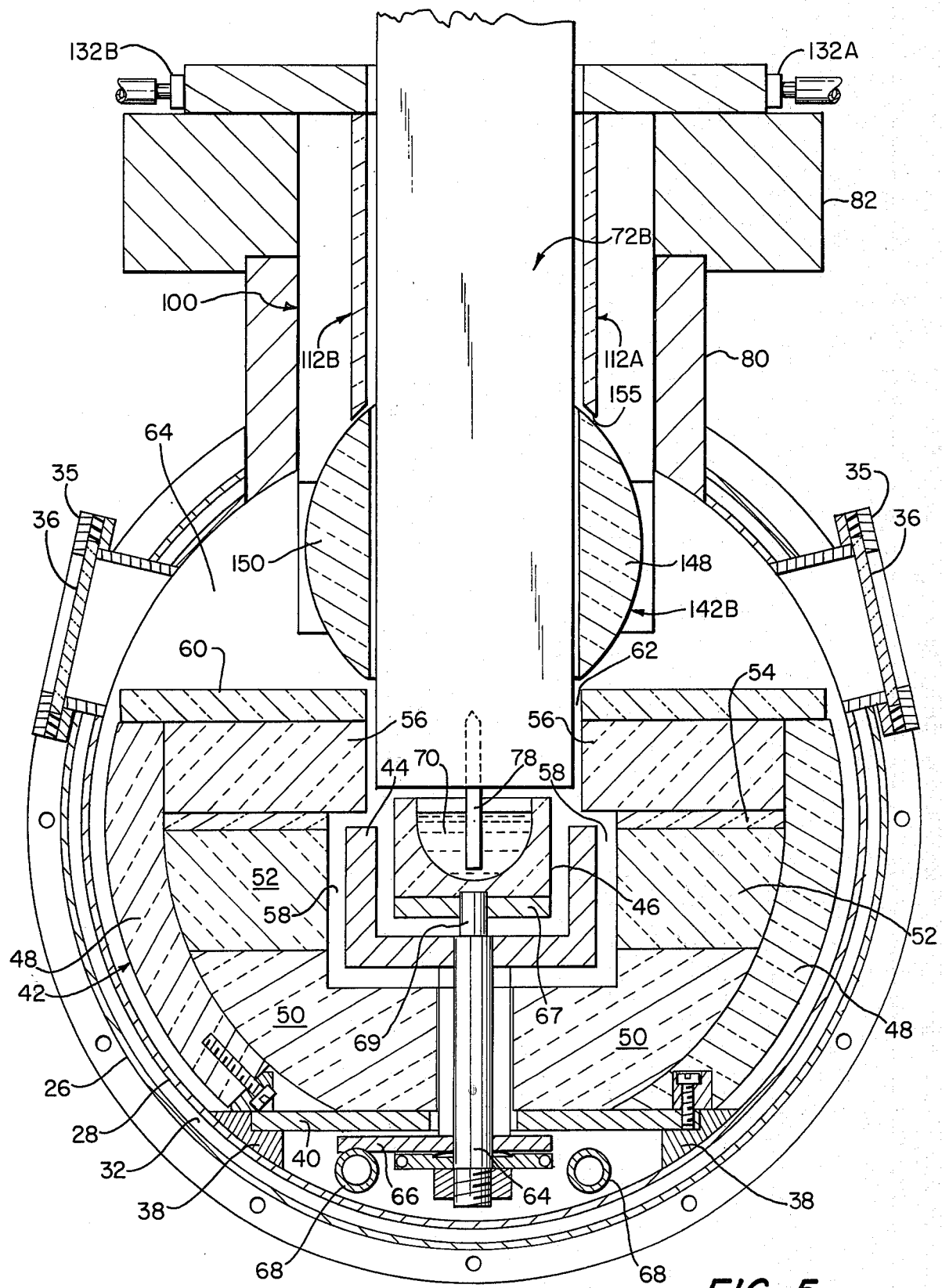
FIG. 5 is an enlarged cross-sectional view of the furnace, taken along line 5—5 of FIG. 2, with a cartridge disposed within the furnace.

Turning now to FIGS. 2 and 5, there is shown an apparatus which comprises a furnace in the form of a horizontal enclosure 20 supported on a frame 24 and comprising a double wall outer shell consisting of concentric steel cylinders 26 and 28 which cooperate with annular end walls 30 to form a water jacket having a space 32 through which cooling water is circulated. Each end of the furnace is closed off by a circular cover plate 34 which is bolted to the corresponding end wall 30.

The furnace enclosure includes at least one and preferably two sight ports 35 which are fitted with hermetically sealed windows 36 and the furnace is arranged as hereinafter described to provide three distinct crystal growing stations which share a common melt supply.

Mounted within the furnace enclosure are two slide blocks 38 on which is slidably supported a carriage 40. Carriage 40 carries a heat insulation pack identified generally by the numeral 42, an electrical heater element 44, and a crucible 46. The slide blocks 38 allow the carriage to be pulled out of one end of the enclosure to provide access to the components which it carries, in particular for replenishment of the melt. The carriage may be attached to one of the doors 34 so as to be movable with the door when the latter is detached and pulled away from the furnace entrance.

The insulation pack is elongated in a direction of the length of the furnace, as is the crucible 46 and the heater 44. The insulation pack may take various forms, depending upon the material being grown. In a preferred embodiment of the invention which is designed for growing silicon, the insulation pack 42 is made of porous graphite and consists of a plurality of separate elements to facilitate assembly around the heater 44 and the crucible 46. In the illustrated embodiment, the insulation pack comprises two or more pairs of oppositely disposed curved side ribs 48 which are secured to the carriage 40 and a top plate 60 so as to form a supporting enclosure for a plurality of blocks of heat insulating material as shown at 50, 52, 54 and 56. The foregoing blocks of heat insulating material are shaped so as to define a chamber 58 for the heater 44 and the crucible 46, and the top plate 60 has an aperture or port 62 for permitting access to the crucible.

Electrical power is supplied to the heater 44 by means of two electrically conductive heater support rods 64 (only one of which is shown), which extend through an opening in the carriage 40 and are attached to the heater 44. Each heater support rod 64 is attached at its outer end to a separate electrically conductive terminal bar 66 (only one of which is shown). Each terminal bar 66 in turn is attached to a separate hollow electrical conductor 68. In FIG. 5, the right-hand electrical conductor 68 serves to transmit power to the second heater support rod 64 which is located at the far end of the furnace. The hollow conductors 68 are adapted (by means not shown) for connection to a source of electric power located externally of the furnace enclosure and are made hollow so that water may be circulated through them for cooling purposes. The conductors which are used to connect the heaters to their electrical power supply are not shown since such means are not part of the present invention.

Crucible 46 is supported on a crucible holder 67 which in turn is supported at several points by individual support rods 69 which are located between the two heater support rods 64. The upper ends of rods 68 may project above holder 67 and extend into pilot holes in the crucible so as to prevent movement of the crucible relative to its holder. The crucible 46 is shown as having a trough-shaped cross-section and in essence is what is commonly termed a "boat". Crucible 46 is used to contain the feed material which by appropriate operation of the heater is converted to a melt as shown at 70.

For growing silicon, it is preferred that crucible 70, holder 67 and its support rods 69, and the entire heater assembly be made of graphite.

Operatively associated with the furnace are three cartridges identified generally by the numeral 72 and specifically as 72A, B or C. Preferably but not necessarily, each cartridge 72 is attached to and supported by a separate pulling mechanism 74 as disclosed by U.S. Pat. No. 4,118,197, with the pulling mechanism being arranged to be raised and lowered in the manner hereinafter described.

Each of the cartridges 72 is constructed in accordance with the teachings of U.S. Pat. No. 4,118,197. Therefore, although not shown in detail, it is to be understood that each cartridge contains a capillary die 78 (FIGS. 2 and 5), plus several associated crystal growth components. The cartridges are vertically elongate and designed for insertion into the furnace. For this purpose the outer shell of the furnace is provided with a single elongate access opening formed by a port 80 through which the several cartridges 72 may be introduced to the furnace enclosure and disposed in the position shown in FIG. 5. Access port 80 is provided with a horizontal flange 82 which serves as a support for the closure mechanism hereinafter described.

The crystal puller assemblies 74 are supported by and are arranged to be reciprocated vertically relative to a support 86. The supports 86 are attached to frame 24. Each support 86 comprises a pair of vertical slide rods 88A and 88B which serve to guide and slidably support the associated pulling mechanism 74. A detailed description of the pullers is omitted since various forms of crystal pullers may be used in practicing this invention. However, as suggested in U.S. Pat. No. 4,118,197 preferably the pullers are of the type employing a pair of mutually confronting endless belts to grip and transport the growing crystal and are constructed in accordance with the teachings of U.S. Pat. No. 3,607,112, issued Sept. 21, 1971 to Seymour Mermelstein for Endless Belt Seed Crystal Gripping and Pulling Means. In the illustrated embodiment, each crystal puller assembly is connected by a cable 92 to a winch 94 which is supported on frame 24. The capstan 96 of each winch is driven by a reversible motor 98 which acts on cable 78 to raise or lower the associated belt puller and cartridge assembly. The winches are disposed so that they can fully withdraw the cartridges from the furnace and preferably elevate them so that the bottom ends of the dies 78 are located a suitable distance above the flange 82. This allows each cartridge to be fully accessible for maintenance and repair.

Referring now to FIGS. 2 and 5, mounted within the access port 80 is a multiple closure assembly identified generally by the numeral 100 (FIGS. 3-6). The closure assembly 100 consists of a header plate 102 which overlies and is supported by the horizontal flange 82 of the furnace enclosure. Plate 102 is releasably secured to flange 82 in an air-tight connection by screw fasteners (not shown). It is to be understood that the multiple closure assembly comprises several identical closure means, one for each cartridge assembly 72; however, for convenience of illustration and description, only two of the closure sections are fully shown in the drawings. For growing silicon the entire multiple closure assembly (except for fitting 132A and B) is made of dense rigid graphite.

The multiple closure assembly comprises two end walls 104 and 106, two intermediate transverse walls 108 and 110, and three pairs of parallel side walls 112A and B, all secured to and depending from header plate 102. Each of the walls 104, 106, 108 and 110 is disposed at a right angle to the side walls 112A and B. These walls coact to form three chambers with rectangular cross sections, and header plate 102 is provided with three rectangular apertures 114 so that the three chambers are open at the top and bottom. The boundaries of apertures 114 are flush with the inner surfaces of the side walls and the associated end walls 104 and 106 or intermediate walls 108 and 110.

Intermediate walls 108 and 110 are identical to one another but differ somewhat from end walls 104 and 106. The intermediate walls are provided with a centrally disposed hole 116 and two additional smaller holes 118. Additionally one face 119 of each intermediate wall is formed with a recess 120 which consists of a rectangular area surmounted by a circularly curved area constituting a segment of a circle, whereby a circularly curved shoulder 122 is formed at the upper margin of the recess. A second recess 124 having the general shape of a sector of a circle is formed in recess 120. This recess is formed so that the shoulder 125 constituting its curved circumferentially-extending margin passes beyond the point of intersection with each of the straight shoulders that constitute its radially-extending side margins, thus forming two peninsula-like extensions 126A and B. The opposite flat face of each intermediate wall is formed with a recess 128 which is identical to recess 120 except that it is not formed with a recess like recess 124. Between its opposite faces each wall 108 and 110 is formed with two interior passageways 130A and 130B which intersect the peninsula-like extension 126A and B respectively. The upper ends of passageways 130A and B communicate with passageways formed in header plate 102 that terminate in hose fittings 132A and B respectively mounted to the header plate. Fittings 132A and B are connected by suitable valve means (not shown) to a source of an inert gas such as argon or helium (not shown) under a suitable pressure, e.g., 10–25 psig. The valve means may constitute two separately operable three-way valves with each valve having a vent port leading to the atmosphere outside of the furnace, and two other ports connected between one of the hose fittings and the source of pressurized gas. Preferably, however, the two hose fittings are connected to the gas source by a single four-way valve (not shown), whereby when one hose fitting is connected to the gas source the other fitting is vented.

The end wall 104 is formed with a recess 134 on its inner face which is identical to recess 128, i.e., the same as recess 120 except that it lacks the secondary recess 124. End wall 104 also has a hole 138 which is aligned with holes 116, plus two smaller holes 140. Holes 140 and also holes 118 are threaded.

End wall 106 is identical to intermediate walls 108 and 110 except that its outer face is flat instead of having a recess corresponding to recess 128. End wall 106 has openings corresponding to openings 116 and 118 of intermediate walls 108 and 110.

Associated with each wall 108, 110 and 106 is a pneumatically operated driver or operator member 180 consisting of a circular hub or rotor 182 and a vane 184. The latter is flat sided, having a rectangular or square cross-section and has a thickness (the dimension parallel to the axis of rotor 182) only slightly less than the depth of recess 124. The length of the vane is such that its free end makes a close sliding fit with shoulder 125. Rotor 182 fits into hole 116 and has a length greater than the thickness of vane 184, so that at one end it protrudes from the surface of recess 128 of walls 108 and 110 or is flush with the flat outside surface of end wall 106, while its opposite end projects beyond the surface of recess 120. Rotor 182 is formed with a non-circular center hole 186 which serves as a key-way as hereinafter described. Each rotor is held in place by a cover plate 143 having a similar edge configuration as recess 120. Each cover plate has a center hole 145 to accommodate one end of rotor 182 and two tapered holes 147 to accommodate tapered head screws 149 which are screwed into holes 118. The inner surface of end plate 143 is flush with the adjacent surface 119 of wall members 108, 110 or 106.

Rotatably disposed in each of the three chambers formed by walls 104, 106, 108, 110 and 112 are three identical closure means 142A, B and C. Each closure means comprises two end plates 146A and 146B secured by additional screws 149 to two side plates 148 and 150. Plates 146A and 146B are flat and have a circular shape except that a segment of a circle has been removed so as to provide a flat edge 152 corresponding to the chord of a circle. Plate 146A has a circular center hole 154 while plate 146B has a centrally located non-circular hole 156 with the same shape and size as keyway 186. Side plates 148 and 150 have flat inner surfaces and circularly curved outer surfaces and correspond to a segment of a circle in cross-section except that each plate is foreshortened along one edge 151 so as to be flush with edges 152.

Each closure means 142 (A, B or C) is sized so that the outer surfaces of its end plates 146A and 146B make a close sliding fit with the confronting surfaces presented by the proximate end and/or intermediate walls, e.g., the surfaces of recess 134 or 128, and the surface of the confronting cover plate 143. The closure means also are sized so that the side plates 148 and 150 make a close sliding fit with the lower edges of side walls 112A and B. Preferably those lower edges are bevelled as shown at 155 in FIG. 5 to permit as close a sliding fit as possible between the closure means and the side walls.

The closure means 142 A–B are rotatably mounted to the transverse walls by three key pins 160 and a journal pin 162. Each key pin 160 consists of a cylindrical head 163 which is sized so as to make a close but sliding fit in hole 116, and a non-cylindrical shank 164 which is shaped and sized so as to fit within a keyway 186 and a hole 156 and make a locking connection with a rotor 182 and a closure means 142. Each key pin also has a threaded hole 166 for receiving a screw 168 (FIG. 3) which coacts with the end wall 146B of the closure means to hold the key pin in place. The inner surface of the end wall 146B of each closure means has a circular countersink to accommodate the head of screw 168 so that the latter will be flush with the inner surface of wall 146B. The journal pin 162 comprises a large head 170 which is attached to end wall 104 by screws 172 received by tapped holes 140, and a round shank 174 which extends through hole 138 and is adapted to fit within and make a close sliding fit with the hole 154 of closure means 142A. Thus, closure means 142 A is supported for rotation by journal pin 162 and the shank of the key pin 160 mounted in wall 108, with the closure means being capable of being driven by the rotor of the driver 180 mounted to wall 108 by virtue of the locking engagement of the key pin shank with the keyhole 156 in plate 146B. Similarly the closure means 142B is supported for rotation by the head of the key pin 160 carried by wall 108 and the shank of the key pin 160 carried by wall 110. Closure means 142C is rotatably mounted by the head of the key pin associated with wall 110 and the shank of the key pin carried by end wall 106.

As is believed obvious from the foregoing description, the cover plates 143 coact with the associated walls 108, 110 and 106 so that effectively each recess 124 is a closed compartment with access thereto limited by passageways 130A and B. Hence if gas under pressure is admitted to a recess 124 by a passageway 130A and simultaneously the other end of the recess is vented by passageway 130B, the vane 184 of the associated driver will be urged pneumatically to move counterclockwise as viewed in FIG. 4. The reverse action will occur if passageway 130A is vented and gas under pressure is applied to passageway 130 B. Movement of a driver clockwise or counterclockwise under the influence of a selectively applied gas will cause corresponding movement of the associated closure means due to the driving connection afforded by the shank of the associated keypin 160 and the keyhole 156 in the end plate 146B. Since separate valve means (not shown) are provided for each pair of hose fittings 132A and B, the several closure means 142A, B and C may be separately operated.

Figure 6:
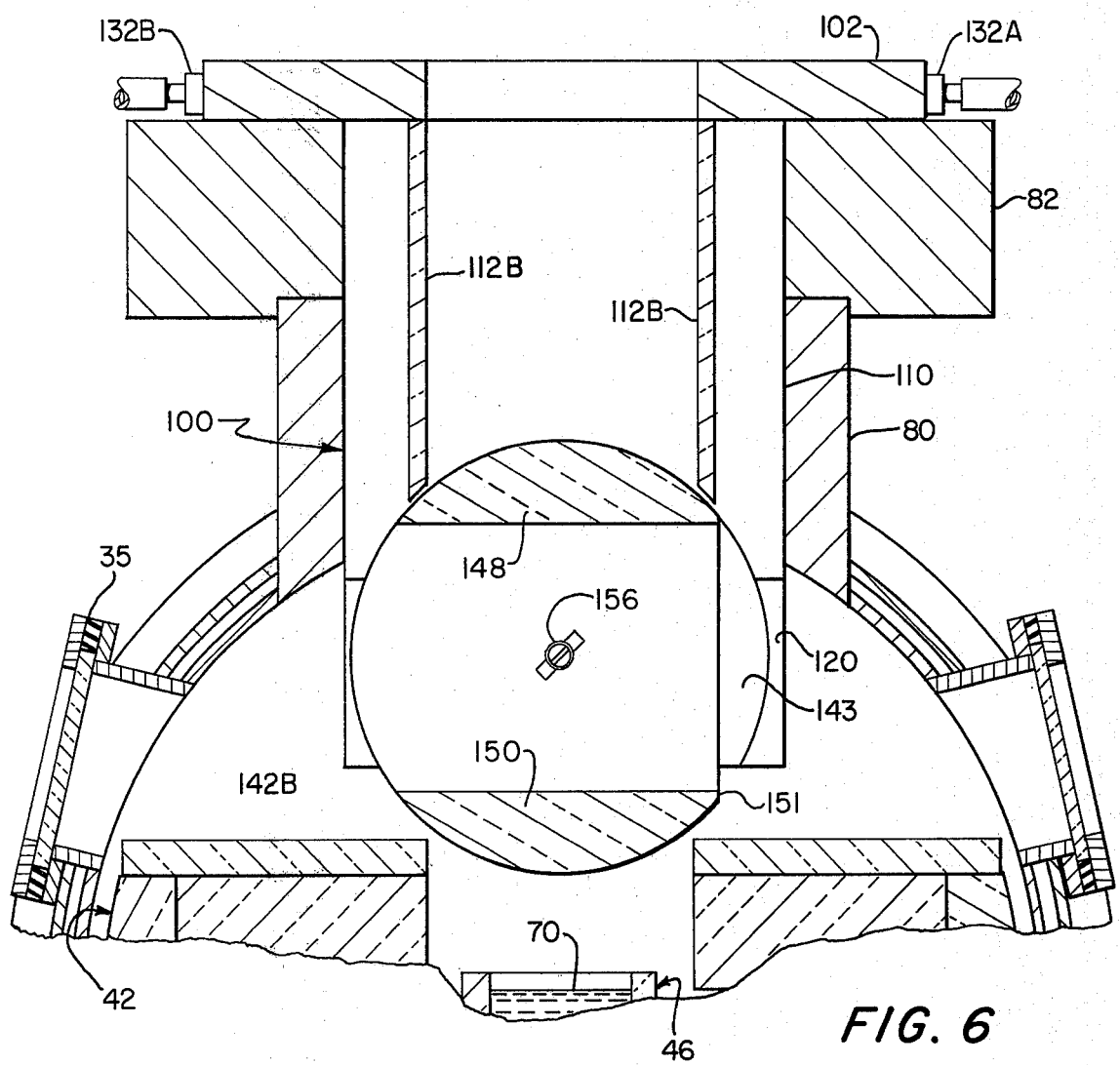
FIG. 6 is a fragmentary view similar to FIG. 5 but with the cartridge removed and the trap door assembly in closed position.

Turning now to FIGS. 3-6, the recesses 124 are made so that the vane 184 of each driver can rotate ninety (90) degrees between two limit positions determined by engagement of the vane with the two shoulders that form the straight radially-extending sides of the recesses. The keyways 186 and the apertures 156 are arranged so that (1) when the driver is in one limit position the associated closure means will be disposed so that the side plates 148 and 150 will extend vertically (the "open position" of the closure means as shown in FIG. 5) and (2) when the driver is in its other limit position the closure means will be disposed so that the same side plates will extend horizontally (the "closed position" of the closure means as shown in FIG. 6).

Referring now to FIGS. 5 and 6, the multiple closure assembly projects down within port 80 so that each closure means is aligned with and lies close to the aperture 62 in the upper end of insulation pack 42. As a result when a closure means is in closed position, one of the side plates 148 and 150 acts as a barrier to loss of heat from the crucible via aperture 60 and also serves to restrict flow of gas through the same aperture. At the same time the other side plate blocks off the bottom opening defined by the lower edges of side walls 112A and 112B, thereby preventing any substantial loss of gas or heat through the openings 114 in header plate 102. When the closure means is in open position, a cartridge 72 may be inserted into the furnace far enough for its capillary die 78 to be immersed in the melt 70 contained in crucible 46. The cartridge 72 is sized so that it makes a close fit with the surrounding walls (e.g. 112A and B, 104 and 108) of the closure assembly, and additionally the edges of side plates 148 and 150 make a close fit with the lower edges of side walls 112A and 112B, with the result that little or no heat loss occurs through the space between the cartridge and the closure assembly and the loss of gas through the same space is limited within acceptable and advantageous limits (some loss of gas is desirable in order to maintain a clean growth environment).

With apparatus as described and illustrated, any one of the cartridges 72 may be moved into or out of the furnace without necessitating interruption of crystal growth with the other cartridges or without adversely affecting such other crystal growth. A further advantage is that the entire multiple closure assembly may be made of the same material and in the case of growing silicon, it is preferred that the entire closure assembly may be made of graphite to reduce contamination of the melt and the grown crystals. Still another advantage is that the multiple closure assembly is relatively simple and easy to put together and take apart. Thus, any one of the closure means 142A-B may be removed and replaced without having to remove all of the other closure assemblies from their respective chambers. Still another advantage is that the operation of the closure assemblies is accomplished without use of components or means which involve the danger or burden of explosion, electrical shock, contamination, or rapid deterioration and frequent replacement.

A further advantage is that the invention is susceptible of a number of modifications. Thus, for example, the furnace also could be made with more than one port 80, and a closure assembly could be provided for each port; also the closure assembly may be built with a different number of closure means, e.g., one, two or four (according to the number of cartridges to be accommodated by the furnace) or with different materials. Thus, for example, the member 150 could be replaced with another member of the same shape made of a porous graphite of the type used for thermal insulation, such as FIBERFORM ®. This modification has the advantage that porous graphite provides better protection against heat loss than dense graphite. Also all of the closure means could be connected to one set of hose fittings, whereby all of the closure means could be made to move in a selected direction at the same time. Another possible modification is to incorporate the previously mentioned three-way or four-way valves (not shown) for operating closure means 142A-C into the multiple closure assembly 100, e.g., built into one or more of walls 106, 108 and 110. The invention also may be used in crystal growing furnaces which do not use cartridges as shown at 72 but instead have capillary dies mounted directly to the crucible, in which case the closure means may be made smaller since the compartments between the walls 112A and B and the associated transverse walls need only be large enough to accommodate the growing crystal body. Other modifications will be obvious to persons skilled in the art.

We claim:

1. A furnace for use in growing crystals from a melt comprising:

enclosure means defining a heating chamber for containing a melt, said enclosure means having an upper side thereto;

means defining a port in said upper side of said enclosure means so as to provide access to said heating chamber;

means for heating a melt contained within said heating chamber;

closure support means mounted to said enclosure and extending vertically into said heating chamber;

closure means disposed within and rotatably mounted to said closure support means within said heating chamber for closing off said port;

remotely controlled means for rotating said closure means within said closure support means so as to selectively open or close off said port; and a pulling mechanism for pulling a crystalline body from a melt in said heating chamber via said port.

2. A furnace according to claim 1 further including a crystal growing cartridge and means for moving said cartridge into and out of said heating chamber via said port, said cartridge comprising a capillary die and means for supporting said die.

3. A furnace according to claim 2 further comprising a crucible and means for supporting said crucible within said heating chamber in line with said port, said crucible having an opening at its upper side whereby said capillary die may be brought into contact with a melt contained in the crucible.

4. A furnace according to claim 3 further including heat flow control means around said crucible for limiting the loss of heat from said crucible, said heat flow control means defining an aperture for access to the opening in said crucible, said closure means being arranged so as to close off said aperture at the same time that it closes off said port.

5. A furnace according to claim 1 having two or more closure means rotatably mounted to said closure support means, and one or more of said remotely controlled means for selectively operating said closure means.

6. A furnace according to claim 1 wherein said remotely controlled means is adapted to pneumatically operate said closure means.

7. A furnace according to claim 1 wherein said closure support means and said closure means are made of graphite.

8. A furnace according to claim 1 wherein said closure support means comprises a housing, means subdividing said housing into at least two compartments each communicating with said port and said heating chamber, a like number of closure means each associated with a different compartment and mounted so as to be rotatable between a first position in which it substantially closes off the corresponding compartment from the heating chamber and a second position in which the same compartment is open to said heating chamber, and said remotely controlled means is adapted to move said closure means from one to the other of said first and second positions.

9. A furnace according to claim 1 wherein said closure means comprises a rotatable hollow assembly having an opening and a closure member in spaced relation about its axis of rotation, said closure means including means for mounting it to said furnace so that said rotatable hollow assembly is disposed within said heating chamber, whereby rotation of said rotatable assembly is effective to selectively place (a) said closure member in blocking relation with said port or (b) said opening in aligned relation with said port, and said remotely controlled means for operating said closure means comprises means for causing said hollow assembly to rotate so as to move said closure member and said opening in blocking or aligned relation respectively with said port.

10. A furnace according to claim 9 wherein said closure means further includes a housing open at its upper and lower ends, said hollow assembly being disposed within the lower end of said housing and rotatably mounted to said housing.

11. A furnace according to claim 10 wherein said means for causing said rotatable assembly to rotate comprises means on said housing forming a chamber having first and second ends, an operator member disposed in said chamber for movement between said first and second ends, and means connecting said operator member to said hollow assembly so that said movement of said operator toward said first or second end will cause said hollow assembly to rotate so as to move said closure member or said opening into blocking relation or aligned relation respectively with said port.

12. A furnace according to claim 11 wherein said remotely controlled means for operatoring said closure means comprises means for applying the pressure of a fluid to one side or the other of said operator member.

13. A furnace according to claim 12 wherein said housing and said hollow assembly are made of graphite.

14. A furnace according to claim 1 wherein said closure means comprises a rotatable hollow assembly having an opening and a closure member in spaced relation about its axis of rotation, said rotatable assembly being disposed and rotatable so as to selectively place said closure member in blocking relation with said port or said opening in aligned relation with said port.

15. A furnace according to claim 14 wherein said closure support means comprises a housing disposed within said port, said housing being open at its upper and lower ends, and said hollow assembly is disposed within the lower end of said housing and is rotatably mounted to said housing.

16. A furnace according to claim 15 wherein said means for operating said closure means comprises a chamber within said housing having first and second ends, an operator member disposed in said chamber for movement between said first and second ends, means connecting said operator member to said hollow assembly so that movement of said operator toward said first or second end will cause said hollow assembly to rotate so as to move said closure member or said opening into blocking relation or aligned relation respectively with said port, and means for selectively forcing said operator member to move toward said first end or said second end of said chamber.

17. A furnace for use in growing crystals from a melt comprising:

enclosure means defining a heating chamber for containing a melt;

means defining a port for access to said heating chamber;

means for heating a melt contained within said heating chamber;

closure means mounted within said enclosure means for closing off said port, said closure means comprising a rotatable hollow assembly having an opening and a closure member in spaced relation about its axis of rotation, with said rotatable assembly being disposed and rotatable so as to selectively place said closure member in blocking relation with said port or said opening in aligned relation with said port; and remotely controlled means for operating said closure means so as to selectively open or close off said port.

18. A furnace according to claim 17 wherein said closure means comprises a housing disposed within said port, said housing being open at its upper and lower ends, and said hollow assembly is disposed within the lower end of said housing and is rotatably mounted to said housing.

19. A furnace according to claim 18 wherein said means for operating said closure means comprises a chamber within said housing having first and second ends, an operator member disposed in said chamber for movement between said first and second ends, means connecting said operator member to said hollow assembly so that movement of said operator toward said first or second end will cause said hollow assembly to rotate so as to move said closure member or said opening into blocking relation or aligned relation respectively with said port, and means for selectively forcing said operator member to move toward said first end or said second end of said chamber.

20. A furnace according to claim 19 wherein said last mentioned means comprises means for applying the pressure of a fluid to one side or the other of said operator member.

21. A furnace for use in growing crystals from a melt comprising:

enclosure means defining a heating chamber for containing a melt;

means defining a port for access to said heating chamber;

means for heating a melt contained within said heating chamber;

closure means mounted within said enclosure means for closing off said port;

remotely controlled means for operating said closure means so as to selectively open or close off said port;

said furnace further including a crystal growing cartridge and means for moving said cartridge into and out of said heating chamber via said port, said cartridge comprising a capillary die and means for supporting said die;

said furance further comprising a crucible and means for supporting said crucible within said heating chamber in line with said port, said crucible having an opening at its upper side whereby said capillary die may be brought into contact with a melt contained in the crucible; and wherein said closure means comprises a housing and a hollow assembly rotatably mounted to said housing, said housing being disposed in said port and having open upper and lower ends and being arranged so that said cartridge may be inserted through it into said heating chamber, said hollow assembly having a hole and a closure member spaced from said hole about its axis of rotation, said rotatable assembly being arranged so that it can be rotated between (a) a first position in which said closure member closes off said port and prevents said cartridge from being inserted into said heating chamber far enough to place said die in contact with a melt contained in the crucible and (b) a second position in which said hole is aligned with said port so as to permit said cartridge to be inserted into said heating chamber far enough for said die to contact a melt contained in said crucible.

22. A furnace for use in growing crystals from a melt comprising:

enclosure means defining a heating chamber for containing a melt;

means defining a port for access to said heating chamber;

means for heating a melt contained within said heating chamber;

closure means mounted within said enclosure means for closing off said port, wherein said closure means comprises a rotatable unit having a hole and a closure member spaced from said hole about its axis of rotation, said unit being rotatable between a first position in which said closure member substantially closes off said port and a second position in which said hole is aligned with said port; and remotely controlled means for operating said closure means so as to selectively open or close off said port.

23. A furnace according to claim 22 wherein said closure means includes a housing and means rotatably mounting said rotatable unit to said housing.

24. A furnace according to claim 23 wherein said housing, said rotatable unit and said mounting means are all made of graphite.

25. A furnace for use in growing crystals from a melt comprising:

enclosure means defining a heating chamber for containing a melt;

means defining a top port for access to said heating chamber;

means for heating a melt contained within said heating chamber;

closure means mounted within said enclosure means for closing off said port, said closure means comprising a housing, means subdividing said housing into at least two compartments each communicating with said port and said heating chamber, a like number of rotatable closure members each associated with a different compartment and mounted so as to be rotatable between a first position in which it substantially closes off the corresponding compartment from the heating chamber and a second position in which the same compartment is open to said heating chamber, the adjacent ends of two closure members being rotatably supported by a common rotatable member;

remotely controlled means for selectively rotating said closure means so as to selectively open or close off said compartments relative to said heating chamber; and means for pulling a crystalline body from a melt contained in said heating chamber via said top port.

* * * * *

UNITED STATES PATENT AND TRADEMARK OFFICE
CERTIFICATE OF CORRECTION

PATENT NO. : 4335081

DATED : June 15, 1982

INVENTOR(S) : Emanual M. Sachs et al

It is certified that error appears in the above-identified patent and that said Letters Patent are hereby corrected as shown below:

Claim 12, Column 12, line 20, the word "operatoring" should be -- operating --.

Signed and Sealed this

Seventeenth Day of August 1982

[SEAL]

Attest:

Attesting Officer

GERALD J. MOSSINGHOFF

Commissioner of Patents and Trademarks